(12) United States Patent
Dujari et al.

(10) Patent No.: US 6,486,589 B1
(45) Date of Patent: Nov. 26, 2002

(54) CIRCUIT CARD ASSEMBLY HAVING CONTROLLED VIBRATIONAL PROPERTIES

(75) Inventors: Prateek Dujari, Portland; Terrance J. Dishongh, Hillsboro; Bin Lian, Hillsboro; Damion T. Searls, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/563,378

(22) Filed: May 3, 2000

(51) Int. Cl.[7] .......................... B06B 1/06; H01L 41/08
(52) U.S. Cl. ..................... 310/331; 310/328; 310/330; 310/339
(58) Field of Search .................. 310/328, 338, 310/339, 330, 331, 316.01, 316.02

(56) References Cited

U.S. PATENT DOCUMENTS

| | | | |
|---|---|---|---|
| 4,711,804 A | 12/1987 | Burgess | 428/210 |
| 4,806,859 A | * 2/1989 | Hetrick | 324/207 |
| 4,849,668 A | * 7/1989 | Crawley | 310/328 |
| 4,980,699 A | 12/1990 | Tanabe et al. | 346/1.1 |
| 5,251,863 A | 10/1993 | Gossman et al. | 248/550 |
| 5,387,834 A | 2/1995 | Suzuki | 310/317 |
| 5,424,596 A | 6/1995 | Mendelhall et al. | 310/328 |
| 5,458,222 A | 10/1995 | Pla et al. | 188/378 |
| 5,525,853 A | * 6/1996 | Nye et al. | 310/316.01 |
| 5,650,685 A | * 7/1997 | Kosinski et al. | 310/316.01 |
| 5,821,666 A | * 10/1998 | Matsumoto et al. | 310/316.01 |
| 5,996,418 A | 12/1999 | Rector et al. | 73/702 |
| 6,069,433 A | 5/2000 | Lazarus et al. | 310/333 |
| 6,102,426 A | * 8/2000 | Lazarus et al. | 280/602 |
| 6,147,434 A | 11/2000 | Nakano et al. | 310/317 |
| 6,191,519 B1 | * 2/2001 | Nye et al. | 310/316.01 |
| 6,252,334 B1 | * 6/2001 | Nye et al. | 310/328 |

FOREIGN PATENT DOCUMENTS

| | | | |
|---|---|---|---|
| EP | 0806589 | 11/1997 | F16F/15/02 |
| GB | 2324434 | 10/1998 | G10K/11/178 |
| JP | 1-135656 | 5/1989 | B41J/3/10 |
| JP | 2-166403 | 6/1990 | G02B/5/10 |
| JP | 4-208584 | 7/1992 | H01S/3/139 |
| JP | 6-021588 | 1/1994 | H05K/1/02 |

OTHER PUBLICATIONS

Sealing, C., et al., "Accelerated Stress Testing and Health Monitoring of Laminated Circuit Card Assemblies Using Piezoelectric Actuators and Sensors", Proceedings of the 13th Annual Technical Conference on Composite Materials, 11 pages., (Sep. 21–23 1998).

* cited by examiner

*Primary Examiner*—Thomas M. Dougherty
(74) *Attorney, Agent, or Firm*—Schwegman, Lundberg, Woessner & Kluth, P.A.

(57) ABSTRACT

Piezoelectric wafers are affixed to a circuit card to control displacement of the circuit card when vibrated. A trigger wafer located at an anti-node of the dominant mode shape produces a voltage as a function of modal displacement. A control system responsive to the trigger wafer produces voltages that are applied to flex wafers at a different anti-node of the dominant mode shape. The flex wafers expand and contract in a manner that reduces the modal displacement of the circuit card. Multiple flex wafers can exist, affixed to the circuit card substantially opposite each other, or a single flex wafer can exist with a single trigger wafer. The trigger wafer can be located substantially opposite the flex wafer or can be located elsewhere on the circuit card.

13 Claims, 2 Drawing Sheets

CIRCUIT CARD ASSEMBLY HAVING CONTROLLED VIBRATIONAL PROPERTIES

FIELD

The present invention relates generally to printed circuit cards, and more specifically to printed circuit card assemblies having controlled vibrational properties.

BACKGROUND OF THE INVENTION

Rapid advances in technology and increasing consumer demand are driving manufacturers and suppliers of electronics systems to increase the population density of devices on circuit cards, and to populate the circuit cards with more powerful circuit devices. As both the number and power consumption of the circuit devices on a circuit card increase, more heat is produced in the card. Dissipation of these large amounts of heat require the use of more numerous, larger and more massive heat sinks.

The increased number and large mass of such heat sinks can significantly alter the vibrational characteristics of the circuit card assemblies on which they are mounted, by producing large displacements of the circuit card that can overstress various physical components on the circuit card assembly and lead to early failures. The size and location of these large displacements can be controlled primarily by a single heat sink that is very large, or by a distribution of heat sinks of varying sizes.

Failures due to vibration induced displacements can occur in different applications. Of particular concern are applications that experience a significant amount of vibration, such as those in mobile environments. Circuit card assemblies mounted in mobile environments often endure significant amounts of vibration, causing the circuit card assemblies to produce large displacements.

For the reasons stated above, and for other reasons stated below which will become apparent to those skilled in the art upon reading and understanding the present specification, there is a need in the art for a method and apparatus to control vibrational properties of circuit card assemblies.

DESCRIPTION OF EMBODIMENTS

Figure 1A:
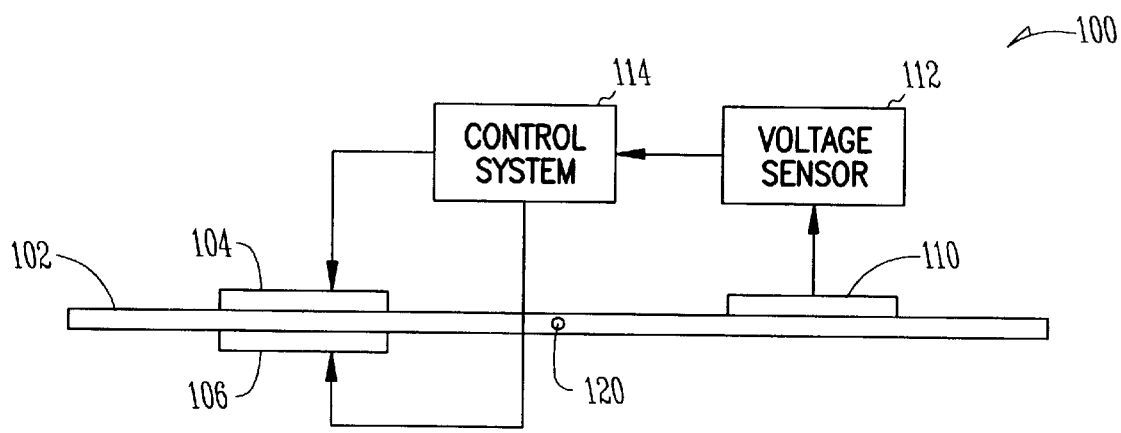
FIGS. 1A and 1B show edge views of a generally planar circuit card assembly in accordance with an embodiment of the invention.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism for altering the vibrational properties of circuit cards and circuit card assemblies. In some embodiments, piezoelectric wafers are intimately affixed to circuit cards to control expansion and contraction as a function of circuit card displacement. The piezoelectric wafers can have a voltage imposed thereon to control expansion. In some embodiments, piezoelectric wafers are affixed to opposing sides of a circuit card. When the circuit card flexes, a voltage is applied to one or more of the piezoelectric wafers, which in turn expand or contract.

Piezoelectric wafers can also be used to detect when a circuit card is flexing. In some embodiments, a piezoelectric wafer affixed to the circuit card generates a voltage as the circuit card flexes, and provides the voltage to a control system that applies a voltage to the other piezoelectric wafers. As a result, displacement of the circuit card can be reduced when the circuit card is vibrated.

FIG. 1A shows an edge view of a generally planar circuit card assembly. Circuit card assembly 100 includes circuit card 102 having piezoelectric wafers 104, 106, and 110 affixed thereto. Piezoelectricity is a property of certain classes of crystalline materials. When an electric field is applied to a polarized piezoelectric material, the crystalline structure changes shape, producing dimensional changes in the material in a specific plane, governed by the polarization. Conversely, when mechanical pressure is applied to one of these materials, the crystalline structure produces a voltage proportional to the pressure.

Piezoelectric wafers 104, 106, and 110 are affixed to circuit card 102 during manufacture of the circuit card. Piezoelectric wafers 104, 106, and 110 can be any type of material having piezoelectric properties. One such example is PZT-5H Bimorph available from Morgan Mitroc, Inc. PZT-5H has high permissivity and coupling, and also has high piezoelectric constant. Piezoelectric wafers 104, 106, and 110 are examples of deformable blocks that deform in a controlled manner, causing the circuit card to deform in a controlled manner. Any type of deformable block can be used without departing from the scope of the present invention.

The method and apparatus of the present invention allows the transformation from electrical energy to mechanical energy by affixing piezoelectric material to circuit card 102. When an electrical potential is applied between two electrodes on a piezoelectric wafer affixed to circuit card 102, the piezoelectric wafer expands or contracts and applies a flexing force on the circuit card.

Piezoelectric wafers that are used to generate a voltage as a result of mechanical pressure are hereinafter referred to as "trigger wafers." Piezoelectric wafers that have a voltage applied thereto are hereinafter referred to as "flex wafers." This terminology is in no way meant to limit the use to which a particular piezoelectric wafer can be put. Rather, this terminology is used to facilitate the explanation of the various embodiments that include multiple piezoelectric wafers. In the embodiment of FIG. 1A, wafers 104 and 106 are flex wafers, and wafer 110 is a trigger wafer.

Trigger wafer 110 generates a voltage as circuit card 102 flexes. Voltage sensor 112 senses the voltage and supplies the voltage to control system 114. Control system 114 applies a voltage to flex wafers 104 and 106 as a function of the voltage received from voltage sensor 112. A control loop is formed by circuit card 102, trigger wafer 110, voltage sensor 112, control system 114, and flex wafers 104 and 106. As circuit card 102 flexes, trigger wafer 110 generates a voltage, and control system 114 applies a voltage to flex wafers 104 and 106 to reduce the flexing of circuit card 102. In some embodiments, control system 114 includes amplifiers and filters.

Figure 1B:
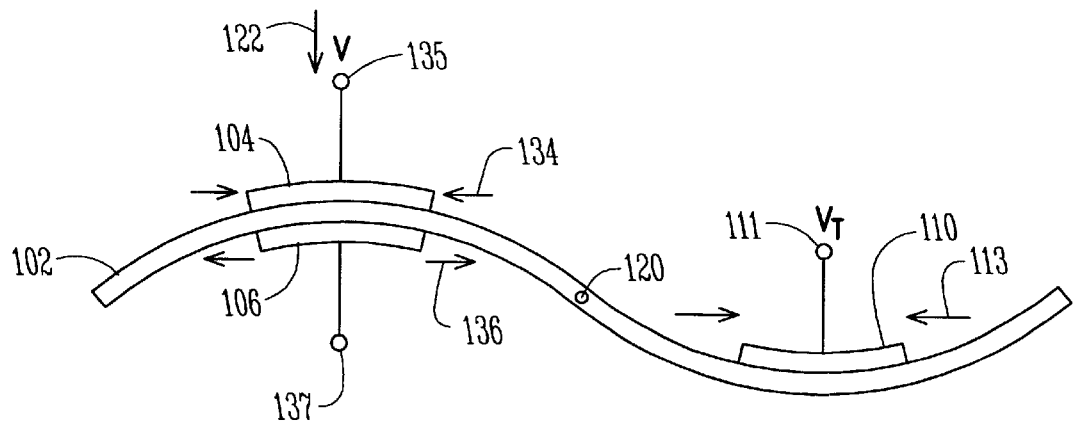

FIG. 1B shows an edge view of a flexing circuit card. As shown in FIG. 1B, circuit card 102 has a mode shape in which node 120 remains substantially still, and the areas about node 120 flex. The term "mode shape" refers to the shape assumed by circuit card 102 as a result of being vibrated. Circuit card 102 has a "dominant mode shape" which is the shape of circuit card 102 when circuit card 102 flexes at a resonant frequency. Circuit card 102 can also flex at frequencies different from the resonant frequencies. Displacements of circuit card 102 are generally largest when circuit card 102 flexes in the dominant mode shape. The amount of displacement for any given mode shape is termed "modal displacement." Regions of largest modal displacements are termed "anti-nodes" and are shown as anti-nodes 122 and 124. Trigger wafer 110, as a result of mechanical pressure 113 caused by the flexing of circuit card 102, produces a voltage at node 111. As circuit card 102 flexes over time, voltage 111 changes accordingly.

Flex wafers 104 and 106 are configured to receive voltages on nodes 135 and 137 respectively. Control system 114 (FIG. 1A) applies voltages to nodes 135 and 137, and forces 134 and 136 result. Flex wafer 104, undergoing force 134, works against the deformation of circuit card 102 shown in FIG. 1B. Likewise, flex wafer 106, undergoing force 136, also works against the current deformation of circuit card 102.

Circuit card 102, as shown in FIG. 1B, represents the deformation of a circuit card at a fixed point in time. In some embodiments, circuit card 102 flexes back and forth such that the voltage at node 111 generated by trigger wafer 110 oscillates. Referring now back to FIG. 1A, control system 114 receives an oscillating voltage from voltage sensor 112 as circuit card 102 vibrates. In response, control system 114 applies oscillating voltages to flex wafers 104 and 106. For example, the voltage generated by trigger wafer 110 can be of the form:

$$A \sin(\omega t) \quad \text{Eq. 1.}$$

where A is the amplitude and $\omega$ is the natural frequency of the dominant mode shape that is desired to be controlled. In response to this voltage, control system 114 produces two signals. One is of the form:

$$B \sin(\omega t + \theta) \quad \text{Eq. 2}$$

and is applied to flex wafer 104. The other signal is of the form:

$$C \sin(\omega t + \pi + \theta) \quad \text{Eq. 3}$$

and is applied to flex wafer 106. B and C represent the amplitudes of the signals applied to flex wafers 104 and 106, respectively. In some embodiments, B and C are the same. An offset angle, $\theta$, is applied to both signals as appropriate by control system 114. Values for B, C, and $\theta$ can be derived by one skilled in the art of control system theory. These values are preferably chosen such that adequate gain and phase margins exist to keep the control loop stable. Flex wafers 104 and 106 have signals 180 degrees out phase applied thereto, as shown by the symbol $\pi$. This ensures that flex wafers 104 and 106 work together to counteract the flexing of circuit card 102.

Flex wafers 104 and 106 are shown mounted to opposing sides of circuit card 102 at anti-node region 122. Trigger wafer 110 is shown mounted at a separate anti-node region 124. In some embodiments, trigger wafer 110 is mounted near anti-node region 122, such that trigger wafer 110 is in close proximity to flex wafers 104 and 106.

In the embodiment shown in FIG. 1B, a mode shape is shown having node 120 and anti-nodes 122 and 124. A circuit card can take on more than one mode shape. For example, under differing vibration environments, the cross-section of circuit card 102 shown in FIG. 1B can have two or more nodes 120, and three or more anti-nodes. In some embodiments, multiple trigger wafers are positioned on circuit card 102 such that a trigger wafer is located at at least one anti-node of each mode shade. In some embodiments, a separate control system 114 (FIG. 1A) is incorporated for each mode shape, such that deformation of circuit card 102 can be reduced for more than one mode shape.

Figure 2:
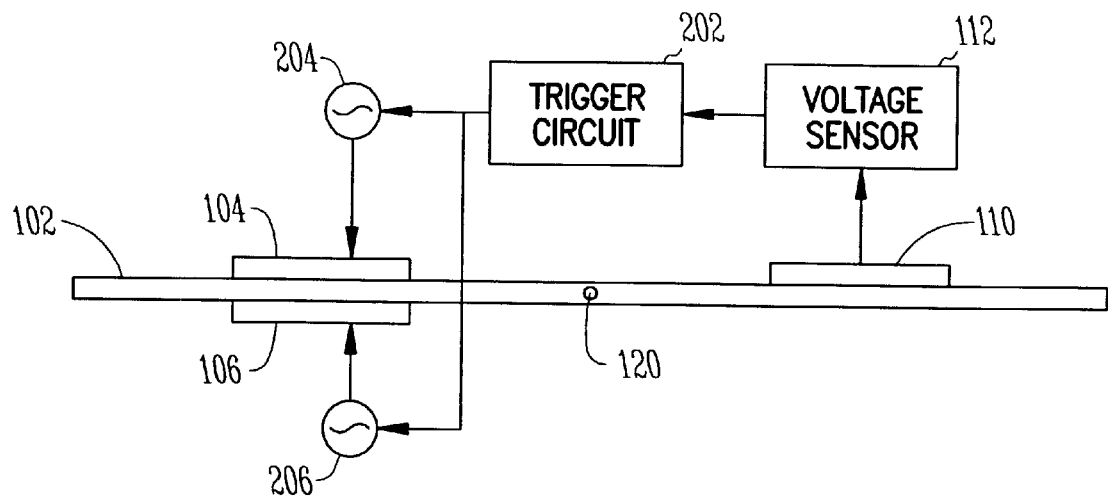
FIGS. 2 and 3 show edge views of alternate embodiments of circuit card assemblies.

FIG. 2 shows an edge view of an alternate embodiment of a circuit card assembly having controlled vibrational properties. Circuit card 120 includes trigger wafer 110 and flex wafers 104 and 106. Control system 114 (FIG. 1A) is replaced in FIG. 2 by trigger circuit 202 and oscillators 204 and 206. Trigger circuit 202 senses a voltage provided by voltage sensor 112. When the voltage exceeds a threshold, trigger circuit 202 triggers oscillators 204 and 206 that generate signals at the frequency of the standing wave induced in circuit card 120 by vibratory forces. Oscillators 204 and 206 are substantially 180 degrees out of phase such that the mechanical forces produced by flex wafers 104 and 106 are substantially opposite. For example, when flex wafer 104 is expanding, flex wafer 106 is contracting.

In some embodiments, trigger circuit 202 can include circuitry that adjusts the amplitude of signals generated by oscillators 204 and 206 as a function of the voltage received from voltage sensor 112. In other embodiments, trigger circuit 202 senses when the voltage from voltage sensor 112 exceeds a threshold, and turns oscillators 204 and 206 on and off without adjusting the amplitude of the signals produced.

In some embodiments, trigger circuit 202 includes circuitry to detect the frequency of the signal produced by voltage sensor 112. When the frequency of the signal from voltage sensor 112 matches the frequency of the mode shape that flex wafers 104 and 106 suppress, then trigger circuit 202 turns on oscillators 204 and 206. When the frequency does not match, then the current mode of circuit card 120 may be one different from that which flex wafers 104 and 106 suppress, and oscillators 204 and 206 are not turned on.

Figure 3:
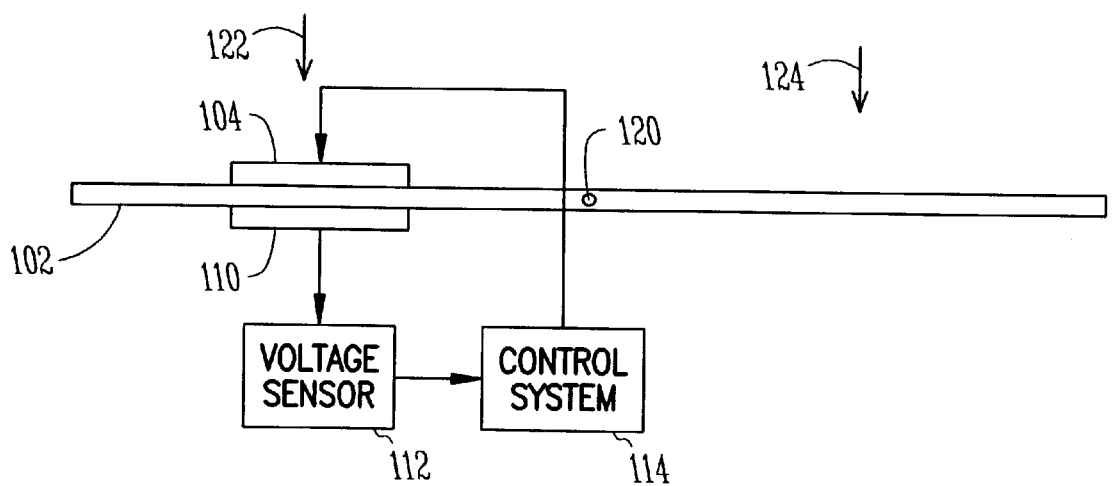

FIG. 3 shows an edge view of an alternate embodiment of a circuit card having controlled vibrational properties. Circuit card 120, as shown in FIG. 3, includes one flex wafer 104 at anti-node 122, and trigger wafer 110 at anti-node 124. Trigger wafer 110 can be affixed to circuit card 120 on either the top or the bottom. In the embodiment shown in FIG. 2, trigger wafer 110 is shown on the bottom.

In some embodiments, trigger wafer 110 is affixed to circuit card 120 substantially opposite flex wafer 104. In these embodiments, modal displacements can be reduced regardless of the mode shape, in part because the voltage applied to flex wafer 104 is a function of its own displacement. Since trigger wafer 110 is affixed substantially opposite flex wafer 104, they both undergo substantially the same displacement, and the voltage generated by trigger wafer 110 can provide useful feedback to flex wafer 104 regardless of the mode shape. In some embodiments, locations other than nodes or anti-nodes can be selected for affixing wafers in accordance with the present invention.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A circuit card comprising:
   a top side and a bottom side;
   a deformable block affixed to the top side, wherein the deformable block is configured to exhibit a controlled deformation as a function of a voltage applied thereto;
   a second deformable block affixed to the bottom side at a point substantially opposed to the deformable block affixed to the top side; and
   a control system coupled to the first and second deformable blocks, the control system configured to detect displacement of the circuit card, to apply the voltage to the deformable block as a function thereof, and to apply a voltage to the second deformable block that is substantially 180 degrees out of phase relative to the voltage applied to the deformable block affixed to the top side;
   wherein the voltages supplied to the first and second deformable blocks are not the same amplitude.

2. The circuit card of claim 1 wherein the deformable block comprises a crystalline material having piezoelectric properties.

3. The circuit card of claim 1 wherein:
   the circuit card exhibits a dominant mode shape when vibrated, the dominant mode shape having a region of large modal displacement; and
   the deformable blocks affixed to the top and bottom sides of the circuit card are located at substantially the region of large modal displacement.

4. The circuit card of claim 3 wherein the deformable blocks affixed to the top and bottom sides are piezoelectric wafers, the circuit card further comprising:
   a trigger wafer affixed to the circuit card at a location that flexes when the circuit card is vibrated, such that the control system is responsive to a voltage produced by the trigger wafer.

5. The circuit card assembly comprising:
   a circuit card;
   a pair of piezoelectric wafers mounted to opposite sides of the circuit card at a first anti-node region of the circuit card;
   a trigger wafer mounted to the circuit card at a second anti-node region of the circuit card;
   a voltage sensor coupled to the trigger wafer; and
   a control system coupled between the voltage sensor and the pair of piezoelectric wafers, the control system being configured to supply separate electric potentials to the pair of piezoelectric wafers responsive to a voltage received from the voltage sensor;
   wherein the control system comprises a trigger circuit configured to supply the separate electric potentials when the voltage received from the voltage sensor exceeds a threshold.

6. The circuit card of claim 5 wherein the separate electric potentials supplied to the pair of piezoelectric wafers are at substantially the same amplitude.

7. The circuit card of claim 5 wherein the separate electric potentials supplied to the pair of piezoelectric wafers are not the same amplitude.

8. The circuit card assembly comprising:
   a circuit card;
   a pair of piezoelectric wafers mounted to opposite sides of the circuit card at a first anti-node region of the circuit card;
   a trigger mounted to the circuit card at a second anti-node region of the circuit card;
   a voltage sensor coupled to the trigger wafer; and
   a control system coupled between the voltage sensor and the pair of piezoelectric wafers, the control system being configured to supply separate electric potentials to the pair of piezoelectric wafers responsive to a voltage received from the voltage sensor;
   wherein the control system comprises an amplifier that supplies the separate electric potentials substantially 180 degrees out of phase relative to each other, and wherein the separate electric potentials supplied to the pair of piezoelectric wafers are not the same amplitude.

9. A circuit card assembly comprising:
   a first side, and a second side opposing the first side;
   a first piezoelectric wafer affixed to the first side, the first piezoelectric wafer being configured to receive a first voltage and deform in response thereto;
   a second piezoelectric wafer affixed to the second side, the second piezoelectric wafer being configured to supply a secong voltage in response to being deformed;
   a third piezoelectric wafer affixed to the second side, the third piezoelectric wafer being configured to receive a third voltage and deform in response thereto; and
   a control system coupled to the first, second and third piezoelectric wafers, to receive the second voltage and to produce the first and third voltages substantially 180 degrees out of phase;
   wherein the control system is configured to produce the first and third voltages at different amplitudes.

10. The circuit card of claim 9 wherein the second piezoelectric wafer is affixed to the second side substantially opposite the first piezoelectric wafer.

11. The circuit card of claim 9 wherein the first piezoelectric wafer is affixed at a first anti-node of of the circuit card, and the second piezoelectric wafer is affixed at a second anti-node of the circuit card.

12. The circuit card of claim 11 wherein the third piezoelectric wafer is affixed substantially opposite the first piezoelectric wafer.

13. A circuit card comprising:
   a top side and a bottom side;
   a deformable block affixed to the top side, wherein the deformable block is configured to exhibit a controlled deformation as a function of a voltage applied thereto;
   a second deformable block affixed to the bottom side at a point substantially opposed to the deformable block affixed to the top side; and
   a control system coupled to the first and second deformable blocks, the control system configured to detect displacement of the circuit card, to apply the voltage to the deformable block as a function thereof, and to apply a voltage to the second deformable block that is substantially 180 degrees out of phase relative to the voltage applied to the deformable block affixed to the top side;

wherein the deformable blocks affixed to the top and bottom sides are piezoelectric wafers, the circuit card further comprising a trigger wafer affixed to the circuit card at a location that flexes when the circuit card is vibrated, such that the control system is responsive to a voltage produced by the trigger wafer; and wherein the control system comprises a trigger circuit coupled to the trigger wafer, the trigger circuit configured to supply the voltages to the first and second deformable blocks when the voltage received from the trigger wafer exceeds a threshold.

* * * * *

UNITED STATES PATENT AND TRADEMARK OFFICE
CERTIFICATE OF CORRECTION

PATENT NO. : 6,486,589 B1
DATED : November 26, 2002
INVENTOR(S) : Prateek Dujari et al.

It is certified that error appears in the above-identified patent and that said Letters Patent is hereby corrected as shown below:

Title page,
Item [56], References Cited, OTHER PUBLICATIONS, delete "." after "pages".

Column 5,
Line 50, delete "The" before "circuit" and insert -- A --, therefor.

Column 6,
Line 7, delete "The" before "circuit" and insert -- A --, therefor.
Line 13, insert -- wafer -- next to "trigger".
Line 27, delete "assembly" next to "card".
Line 49, delete "of" next to "anti-node".

Signed and Sealed this

Fourth Day of November, 2003

JAMES E. ROGAN
*Director of the United States Patent and Trademark Office*